United States Patent [19]

Morse

[11] Patent Number: 4,812,686

[45] Date of Patent: Mar. 14, 1989

[54] PULSE AMPLIFIER

[75] Inventor: Alfred W. Morse, Ellicott City, Md.

[73] Assignee: Westinghouse Electric Corp., Pittsburgh, Pa.

[21] Appl. No.: 92,966

[22] Filed: Sep. 3, 1987

[51] Int. Cl.$^4$ ............................ G06G 7/10; G06G 7/11
[52] U.S. Cl. ..................................... 307/491; 307/246; 307/296 R
[58] Field of Search ..................... 307/490, 491, 296.1, 307/296.4, 253, 246; 330/127

[56] References Cited

U.S. PATENT DOCUMENTS 2,666,817  1/1954  Raisbeck et al. ................ 307/296 R
3,571,614  3/1971  Rolstead ............................ 307/253

OTHER PUBLICATIONS

"Fault-Current in Power-Conditioning Units Using Power Transistors", by P. D. Evans, IEE Proc., vol. 128 P & B, No. 6, Nov. 1981.

*Primary Examiner*—William L. Sikes
*Assistant Examiner*—Richard Roseen
*Attorney, Agent, or Firm*—W. G. Sutcliff

[57] ABSTRACT

A class B or class C pulsed RF transistor amplifier having a passive LC energy storage network. The capacitors of the network are charged to a safe non-operating voltage substantially higher than the operating voltage. The inductances and capacitances of the network are sized so that the capacitors discharge with decreasing frequency; and the capacitor nearest the transistor discharges rapidly to the operating voltage during the first part of each pulse. The pulsed amplifier eliminates the need for a line-type modulator which would otherwise be required to modulate voltage to the switching transistor to prevent transistor breakdown.

15 Claims, 4 Drawing Sheets

PULSE AMPLIFIER

BACKGROUND OF THE INVENTION

The present invention relates to a pulsed amplifying system and method; and more particularly, to an improved pulsed amplifier and method of the type using energy storage capacitance for supplying pulsed power supply current to a load.

Amplifiers which operate in modes class B or C have a DC bias which leaves the device non-conducting in the absence of an AC drive signal. When a drive signal is impressed on the input electrode (usually a base, emitter, or gate) the amplifier conducts over approximately half of the input AC cycle. The DC component of this current is drawn from the power supply, which is the ultimate source of energy for the AC output signal. For pulsed RF amplifiers, the DC drawn by the transistor is in the form of current pulses, having a duration, rise, and fall times of the RF envelope. It is generally required to have an energy storage capacitor which supplies this pulsed DC current; and the power supply then provides only a relatively smooth recharge current to the capacitor.

For systems with long pulse widths, such as in the neighborhood of 100 microseconds and longer, for example, the energy storage capacitor can become quite large, and consume a significant portion of the total system weight because it must supply all the energy to the transistor amplifier for a single pulse, and do it without much voltage droop. The initial voltage on the energy storage capacitor is chosen to be the maximum that allows reliable operation of the transistor. The capacitor is sized to hold voltage droop to the level which still provides acceptable power out of the amplifier. To a first order approximation, the transistor output power droop is inversely proportional to the square of the capacitor voltage droop. Thus, if the capacitor is large enough to hold voltage droop to five percent, for example, the amplifier output power droops approximately 10 percent, and 90% of the stored energy remains in the capacitor, unused. It is obviously inefficient to store 90% more power in a capacitor bank than is used by the amplifier. This inefficiency shows up in system weight, size, and cost.

In vacuum tube radar transmitters, the energy storage problem is sometimes alleviated by the use of a "line-type" modulator. The line-type modulator uses a pulse forming network (PFN) instead of a brute force capacitor bank; and the capacitors in the PFN are completely discharged on each pulse. This technique, however, requires a high current electronic switch for the PFN, such as a thyratron, an SCR, or a thyristor, for example. For a solid state transmitter, the line-type modulator represents not only additional system complexity, control circuitry, cost, power consumption, but also constitutes a single thread failure mode affecting all the transistors it would modulate.

SUMMARY OF THE INVENTION

One of the objects of the present invention is to provide an improved amplifier and method that minimizes the size, cost, and weight of energy storage capacitors.

Another object of the present invention is to provide an improved amplifier system and method that produces a nearly constant and optimum operating voltage during the output pulse.

A further object of the present invention is to provide an improved amplifier system and method that is capable of accommodating any input pulse width up to the design maximum of the amplifier.

A still further object of the present invention is to provide an improved amplifying system and method that is completely passive in design and overcomes the disadvantages of a line-type modulator.

Additional objects and advantages of the invention will be set forth in part in the description which follows, and in part wil be obvious from the description, or may be learned by practice of the invention. The objects and advantages of the invention may be realized and obtained by means of the instrumentalities and combinations particularly pointed out in the appended claims.

To achieve the objects, and in accordance with the purpose of the invention, as embodied and broadly described herein, a pulsed amplifier according to the present invention comprises an electronic switching device having an input electrode means and output electrode means operative to switch between a conducting and nonconducting state in response to the application of spaced pulses to the input electrode means for producing corresponding spaced pulses on the output electrode means. The switching device is capable of withstanding without breakdown, a DC voltage having a first level applied to the output electrode means during the nonconducting state and having an operating DC voltage with a second level less than the first level for application to the output electrode means during the conducting state. A plurality of circuit sections are electrically connected to the output electrode means, each of the circuit sections includes an inductance and a capacitance. Each inductance is series connected to one another; and each capacitance is connected in parallel to each other between each respective inductance. A DC voltage source has its positive terminal connected to one end of a plurality of serially connected circuit sections, with the other end of the serially connected circuit sections being coupled to the output or collector electrode of the electronic switching device. The plurality of circuit sections are charged during the nonconducting state of the switching device providing the capacitance of each circuit section with a voltage substantially corresponding to the first level voltage. The inductance and capacitance of each of the circuit sections have a value effective to discharge the capacitance of each circuit section successively at a decreasing frequency for reducing the applied voltage from the first level to the second level during a selected first portion of the pulse, and maintaining the second voltage value for the duration of the pulse.

In another aspect, the present invention provides for a method of generating amplified output pulses in an amplifier having an electronic switching device with input and output electrodes and a source of DC voltage connected across the output electrodes. The method comprises applying spaced signal pulses to the input electrode, charging a plurality of individual capacitors with a current having a voltage level substantially greater than the operating voltage of the switching device between each of the spaced signal pulses, discharging the current from one of said plurality of individual capacitors in response to the application of a signal pulse to reduce the voltage applied to the output electrode to the operating voltage, and discharging the current from at least one other of the plurality of capacitors for maintaining the operating voltage substantially at the operating level of the switching device for the duration of the pulse.

The accompanying drawings, which are incorporated in and constitute a part of this specification, illustrate one embodiment of the invention, and together with the description, serve to explain the principals of the invention.

DESCRIPTION OF THE PREFERRED EMBODIMENT

Figure 1:
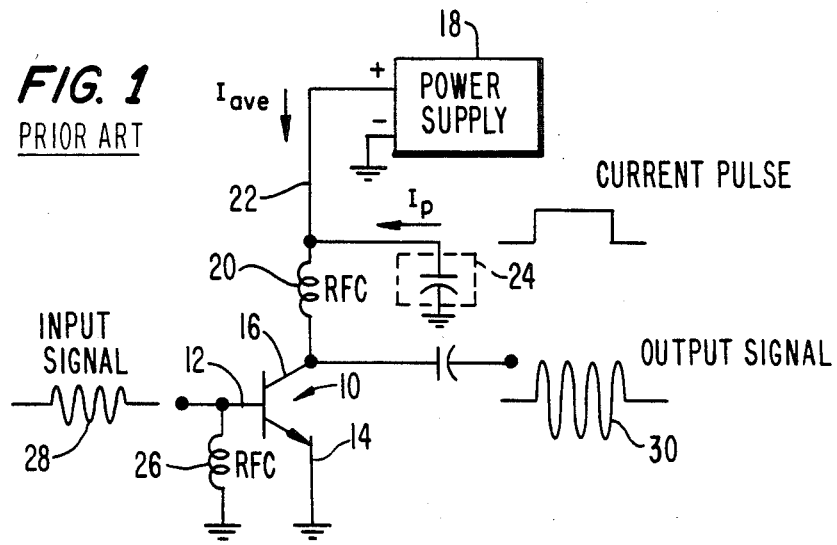
FIG. 1 schematically illustrates a typical basic transistor amplifier utilizing a single capacitor for energy storage.

With reference to the drawings, wherein like reference characters refer to similar parts, FIG. 1, which illustrates a typical solid state amplifier, will be described prior to discussing the present invention. A transistor referred to at 10 includes a base 12, an emitter 14 connected to ground, and a collector 16. A power supply 18 is connected to collector 16 through inductive choke coil 20 over wire 22 to bias transistor 10. The voltage of power supply 18 corresponds to the maximum or optimum operating voltage of transistor 10; and charges a storage capacitor 24 connected at one side to power supply 18 and the other side to ground, during the times that transistor 10 is nonconductive. Choke coil 20 and a choke coil 26, which is connected to base 12 blocks the RF current but permits the DC component of current to flow. Upon the application of an RF pulse 28, as the input signal to base 12, transistor 10 conducts, thus discharging storage capacitor 24 through blocking coil 20 and collector terminal 16 of the transistor 10. The application of input signal 28 and the discharge of capacitor 24 provides an amplified output pulse 30, the amplitude of which depends upon the voltage remaining at capacitor 24 throughout the duration of the pulse. Capacitor 24 must be sized to hold voltage droop to a level which still provides usuable power out of the amplifier as previously mentioned, to a first order approximation the transistor output power droop is proportional to the square of the capacitor voltage droop. If the capacitor is large enough to hold voltage droop to one volt out of an operating voltage of 40 volts, for example, the amplifier output power droops approximately 5 percent. Thus, for a 500 kilowatt amplifier, the transistors would typically draw a total of 22,500 amperes; and with a 350 microsecond pulse width, a total of 7.8 Farads is required to hold voltage droop to one volt. This many capacitors would weigh approximately 275 lbs; and place a severe penalty on a weight limited system.

It should be noted that the amplifying modes of the improved class B or class C amplifier described herein simultaneously provides an RF (or AC) amplifier means for the input signal and a switching load means for the DC power supply. Since the invention utilizes the characteristics ofthe dual AC and DC switching characteristics of class B or C amplifiers, the electronic devices of the amplifier circuit are referred to as switching devices as well as RF amplifying devices.

A pulsed amplifier in accordance with the present invention comprises an electronic switching device having input electrode means and output electrode means operative to switch between a conducting and nonconducting state in response to the application of spaced pulses to the input electrode means for producing corresponding spaced pulses on the output electrode means. As embodied herein and referring to FIG. 2, a pulsed amplifier generally referred to as 32 comprises a transistor 10 having an input electrode means that includes a base 12 of transistor 10, an output electrode means that includes emitter 14 and collector 16 of transistor 10. The transistor 10 is operative to switch between a conducting and nonconducting state in response to the application of an RF input pulse referred to as 28.

In accordance with the invention, the electronic switching device is capable of withstanding without breakdown a DC voltage having a first value applied to the output electrode means during the nonconducting state and having an operating DC voltage with a second value less than the first value for application to the output electrode means during the conducting state. Referring again to FIG. 2 and as embodied herein, the electronic switching device may be any well known RF power transistor that operates class B or class C and is capable of withstanding in a nonconducting state, a voltage substantially higher than the maximum operating voltage of the transistor. In one actual reduction to practice, the transistor 10, was a bipolar transistor commonly known as a PH8680 transistor, manufactured by M/A-COM PHI. However, an FET transistor having the aforesaid operating characteristic may be used. The RF blocking coils 20 and 26 are similar to the blocking coils utilized in the typical power amplifier previously described in connection with FIG. 1.

In accordance with the invention, a plurality of circuit sections are electrically connected to the output electrode means, each of the circuit sections including an inductance and a capacitance, with each inductance being series connected to one another, and each capacitance being connected in parallel to each other between each respective inductance. As embodied herein, and again referring to FIG. 2, a storage network is comprised of circuit sections 34, 36 and 38. Circuit section 34 includes an inductance 40 and a capacitance 42. Circuit section 36 includes an inductance 44 and a capacitance 46. Circuit section 38 includes an inductance 48 and a capacitance 50. Inductance 40, 44 and 48 are connected in series, with one end of the series connection being coupled to collector electrode 16 of the transistor 10 over wire 23 and RF choke coil 20. Series connected sections 34, 36 and 38 are connected at the opposite end to the positive terminal of a DC power supply 52. Capacitor 42 of circuit section 34 has one side connected between inductance 40 and 44 and the other side connected to ground. Capacitance 46 is connected at one side between inductance 44 and 48 and at the other side to ground; and capacitance 50 is connected at one side between the positive terminal of DC power supply 52 and inductance 48, and the other side is connected to ground.

A small RF bypass capacitor 54 is connected at one side between RF choke coil 20 and inductance 40 of circuit section 34, and connected at its other side to ground. Thus, the LC network comprised of circuit sections 34, 36 and 38 replaces the brute-force capacitor bank 24 mentioned in connection with FIG. 1, and results in a substantial decrease in total capacitor size and weight. Such weight reduction is effected in that during each pulse, the capacitors discharge an appreciable percentage of their total capacitance.

Figure 2:
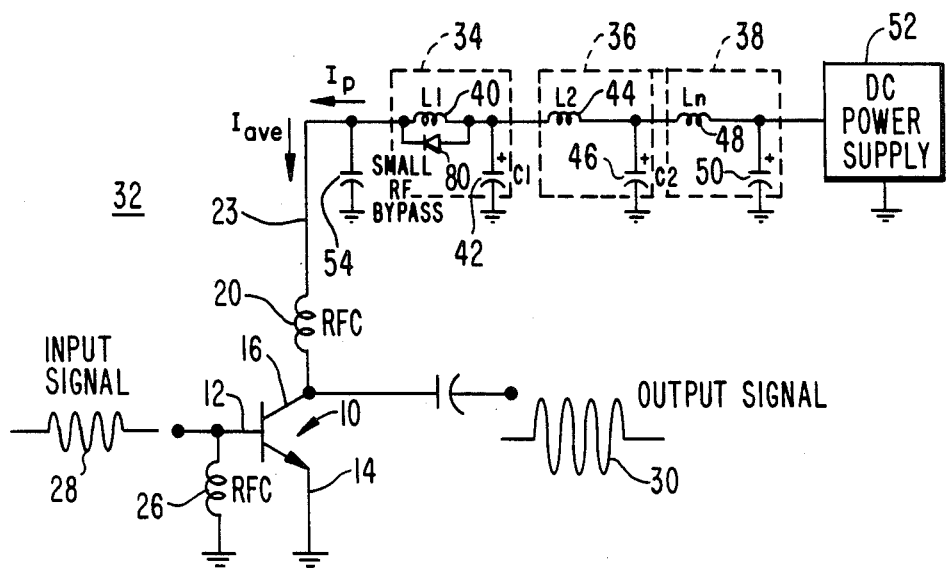
FIG. 2 is a schematic diagram of a transistor amplifier in accordance with one embodiment of the present invention.

The invention further includes a DC voltage source electrically connected to the output electrode means in parallel with the plurality of circuit sections for charging during the non-conducting state of the electronic switching device, the capacitance of each circuit section with current having a voltage substantially corresponding to the previously mentioned first level which is substantially higher than the normal operating voltage of the transistor. Referring to FIG. 2, power supply 52 has its positive terminal connected to the series connected circuit sections and its other terminal connected to ground. Power supply 52 in the aforementioned actual reduction to practice was capable of charging capacitors 42, 46 and 50 between pulses when transistor 10 is nonconducting to approximately 56 volts. The normal operating voltage for the transistor 10 is 40 volts.

In accordance with the invention, the inductance and capacitance of each of the circuit sections 34, 36 and 38 are selected to have a value effective to discharge the capacitance 42, 46 and 50 respectively, of each circuit section successively at a decreasing frequency for reducing the applied voltage from the first level to the second level during a selected first portion of the pulse, and maintaining the second voltage level for the duration of the pulse.

Figure 3:
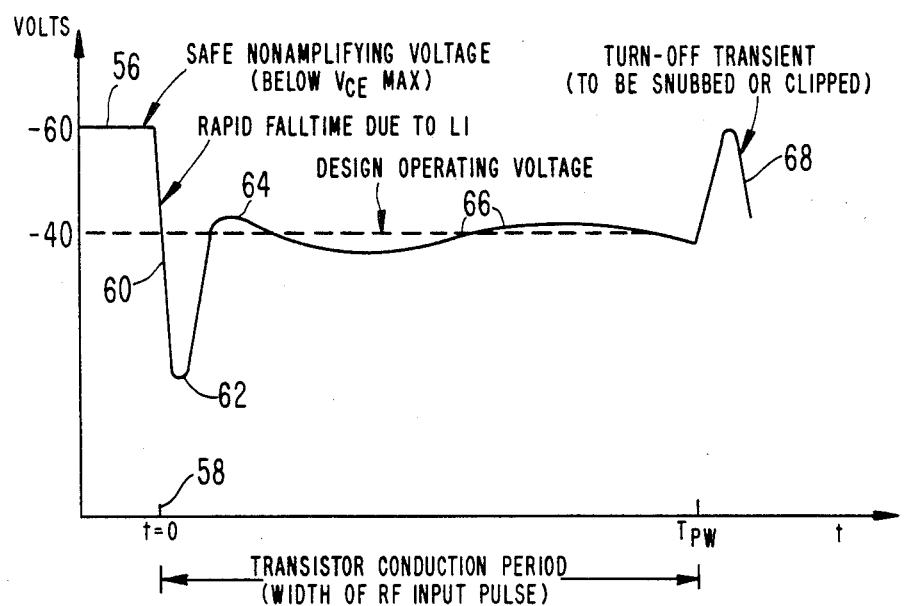
FIG. 3 is a schematic diagram of a voltage waveform illustrating the operation of a pulsed amplifier in accordance with the present invention.

Referring to the diagram of FIG. 3, and recalling that the storage network comprised of circuit sections 34, 36 and 38 is charged to a high voltage represented at 56 of the waveform of FIG. 3, which is prior to the commencement of the output pulse represented at point 58 on the graph. As previously mentioned, capacitor 54 closest to transistor 10 is kept as small as possible and is used only for RF stability. However, inductor 40 which is closest to transistor 10 largely determines the fall of the collector voltage when the drive or input signal 28 is applied to the device. This rapid fall time is represented by slope 60 of the waveform of FIG. 3. Inasmuch as capacitors 42, 46 and 50 are charged to a voltage level substantially above the design operating voltage level of transistor 10, which in the present example is an excess of between 15 and 20 volts, the voltage fall time represented by slope 60, from initial overvoltage to the desired pulse operating voltage, which in the present example is approximately 40 volts, is designed to be fast enough for reliable operation of the transistor. In other words, the voltage must fall rapidly to the safe conducting voltage of the transistor so as not to injure the transistor. For most bipolar transistors, this fall time need only be on the order of 5 microseconds or less. In the one actual reduction to practice referred to previously herein the PH8680 transistor was subjected repetitively to an overstressed voltage operation in the neighborhood of 56 volts for approximately 5 microseconds without adverse consequences. The various values of inductances 40, 44 and 48 and of capacitance 42, 46 and 50 together with the number of circuit sections such as 34, 36 and 38 which are used, control the amount of initial undershoot as represented by 62 of the FIG. 3 waveform, the ensuing overshoot represented at 64, and the flat top ripple and length of the flat top as shown generally at 66. A storage network as described herein includes capacitors which discharge to a much greater extent than the amount of flat top ripple voltage. It is this property which allows for a large decrease in total capacitor size and weight. It has been determined that a 5 to 1 or greater reduction in capacitor size and weight is obtained by the use of the present invention. For example, an amplifier that had a capacitor storage bank in the neighborhood of 275 lbs, now has an energy storage network in the neighborhood of 50 to 60 lbs. Portion 68 of the waveform of FIG. 3 represents a transient that may be snubbed or clipped if desired. However, inasmuch as this is at the tail end of the pulse, it has a negligible affect on the overall operation of the amplifier.

Figure 4:
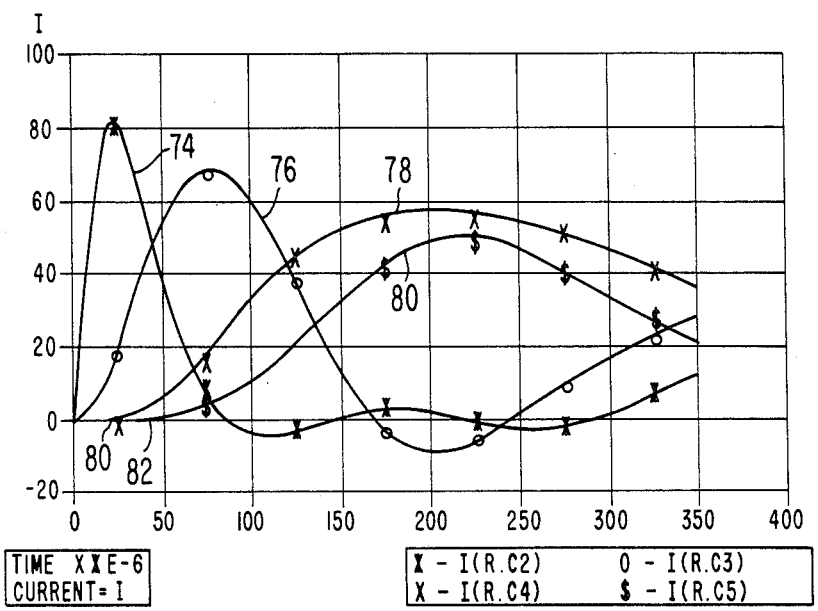
FIG. 4 is a diagram illustrating capacitor currents during an output pulse of an amplifier constructed in accordance with the present invention.

Referring to FIG. 4, a plurality of waveforms illustrates capacitor currents in four major capacitors of a four-section storage network. As seen from FIG. 4, the chosen pulse length is approximately 350 microseconds and supplies approximately 100 amps peak capacity. Curve 74 represents the current in the capacitor closest to the transistor; such as capacitor 42, which was described in connection with FIG. 2. Curve 76 represents the current in the next circuit section such as capacitor 46 of FIG. 2; while curves 78 and 80 represent circuit sections further from the transistor 10. Curve 78 would correspond to circuit section 38 and curve 80 would correspond to an additional series connected circuit section not illustrated. It is noted that the capacitors and inductors are sized so that the curve 74 and 76 which represent the capacitors closest to the transistor of the amplifier have the highest frequency of currents. Thus, these capacitors such as 42 and 44 warrant spending the most weight on them. Lighter weight, lower frequency capacitors such as represented by curves 78 and 80 may be relegated to the rear of the network. Note that the currents of the last two capacitors corresponding to curve 78 and 80 of FIG. 4 are both delayed in time during each pulse as indicated at point 80 and point 82 as well as having a much lower frequency than the capacitors generating the curve 74 and 76. The highest frequency of importance in the example described is approximately 11 kHz, and occurs only in the first capacitor. This of course permits the steep slope 60 or rapid fall time of the voltage at the beginning of each pulse for reliable operation of the transistor as described in connection with FIG. 3. The low audio range of the remaining circuit sections corresponding to curve 78 and 80 will permit relatively light and inexpensive capacitors to be used. A network with a 56 volt charging voltage, and a 40 volt discharge pulse, results in a 7 to 1 reduction in required capacitance. However, as previously mentioned, the practical weight reduction appears to be more in the neighborhood of 4 or 5 to 1. This is because of slightly higher voltage capacitors are needed, and the inductive coils add some weight.

In the example illustrated, a storage network was fabricated with the value of a first inductor such as 40, chosen to remove initial overshoot and smoothly achieve full voltage in approximately 20 microseconds. On turn-off, a large transient spike such as shown at 68 in FIG. 3 occurred because the current in inductor 40 had nowhere to go when the RF transistor of the amplifier turned off. This spike is almost completely removed by a "freewheeling diode" 80 connected across first inductor 40. Diode 80 has no effect on the active portion of the pulse.

In one actual reduction to practice, the first capacitor was a Sprague 673D which was designed to handle large RMS currents. These transistors are specifically designed for switching type power supplies and are well characterized for ESR and RMS current capability. Because of the long pulse width, most of the RMS currents are in the spectrum between one and ten kHz, this is a less critical condition than their usage in switching power supplies. Although individual and isolated inductors may be used as illustrated, it was found to be convenient to fabricate just a single inductive coil with a number of taps corresponding to the number of circuit sections used. This arrangement introduces mutual inductance between the inductors which is beneficial to the pulse shape and RMS current distribution in the network.

Figure 5:
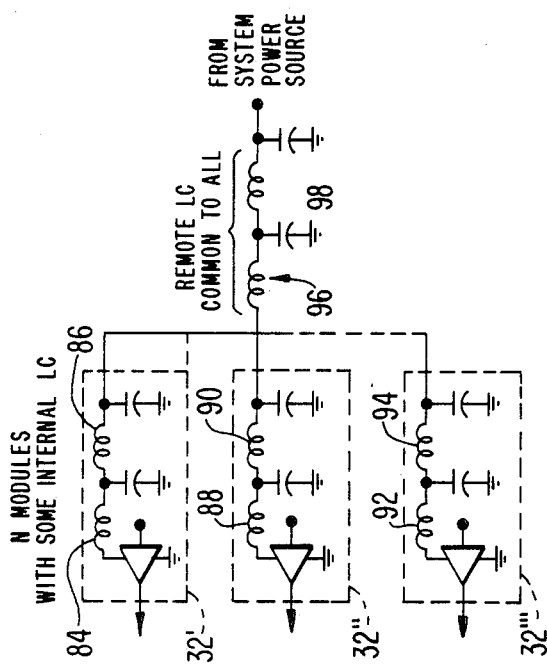
FIG. 5 is a schematic diagram illustrating a plurality of connected amplifier stages in accordance with the present invention.

For certain applications, the energy storage network comprised of circuit sections such as 34, 36 and 38 of FIG. 2 may be distributed throughout a solid state power amplifying system in several ways. For example, and referring to FIG. 5 an amplifier system comprised of modules 32', 32", and 32''', may have the first two circuit sections associated with each of the individual modules and the remaining circuit sections common to all of the modules of the amplifier system. With reference to FIG. 5, module 32' may include circuit sections 84 and 86; while module 32" may include circuit sections 88 and 90; and module 32''' may include circuit sections 92 and 94. Thus, for a four-section network the first two sections for each module as previously described are parallel in each of the several amplifier modules. The last two circuit sections such as 96 and 98 are shared with all of the modules of the amplifying system. This arrangement has the advantage of placing the critical initial inductor as previously described in connection with FIG. 2, and storage capacitors close to the amplifying devices, and remotely placing the bulk of the inductors and capacitors. In this example, the inductors in the back portion of the network are shared by all modules and are relatively small, possibly implemented by controlled lead inductance.

Figure 7:
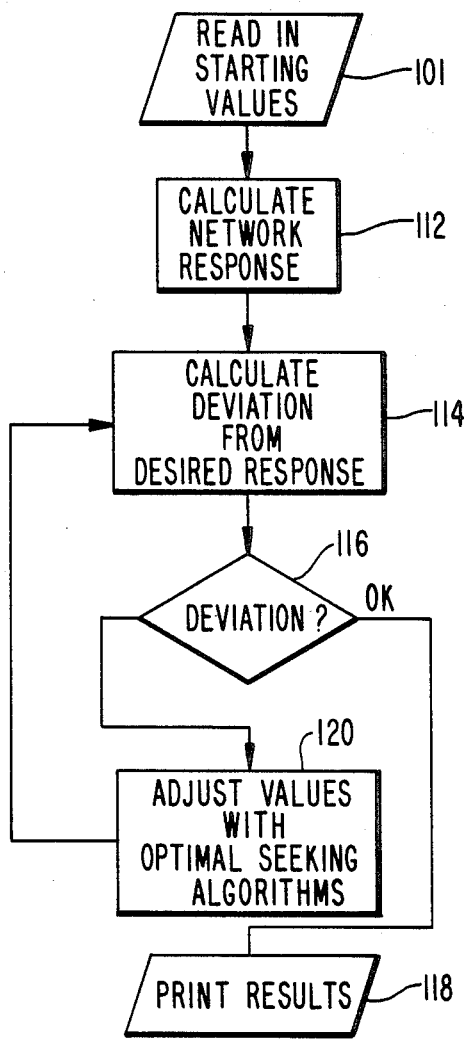
FIG. 7 is a flowchart illustrating the manner in which the inductance and capacitance values are calculated in accordance with the present invention.

Attached to, and forming a part of this specification, is Appendix A having pages A-1 through A-15. Appendix A is a printout of a program for calculating the values of the capacitance and inductance for the various circuit sections used in a storage network of the present invention. As indicated in FIG. 7 at block 101 the starting values are first read into the computer in a conventional manner. Preferably, the non-operating voltage which is applied for charging the various capacitors is entered into the system together with the voltage at which the transistor of a particular amplifier is operated. Additionally, the width of the pulse and the duty cycle is input to the program. Further, the program provides for selecting the frequency for printing out the values DT, TPRINT, such as each microsecond, for example. Also, the tilt factor is calculated where one corresponds to a substantially level voltage value throughout the duration of the pulse.

Figure 6:
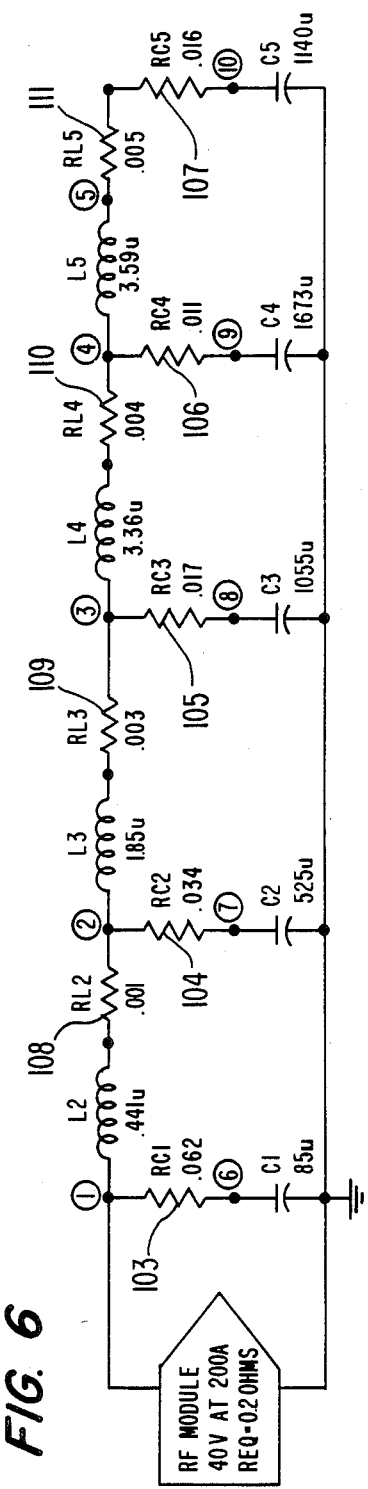
FIG. 6 is a schematic diagram of an equivalent circuit illustrating actual values of capacitance and inductance in the storage network of an amplifier constructed in accordance with the present invention.

With reference to the equivalent circuit of FIG. 6, the capacitive resistance inherent in each of the circuit sections and referred to as 103, 104, 105, 106 and 107 is input into the program as well as the resistance of the inductance in each circuit section referred to at 108, 109, 110 and 111. Such inductive resistance is referred to as RL. The total capacitance of the network is also read into the system and is referred to in the program as CTOTAL. The inductance is inserted as henries and the capacitance is input as Farads in the program. The coupling coefficients between the inductors i and j read in as Kij.

After the starting values are read into the program for calculating the capacitance and resistance values of the storage network, the network response is calculated as indicated at block 112. Then the deviation from the desired network response is calculated as indicated at block 114. If this deviation is within an acceptable range as determined by decision block 116, then the results are printed out as indicated at 118. If the deviation is not within range, the values are adjusted by the optimal seeking algorithms as outlined in the program, and the deviation from desired response is again calculated at block 114.

In one actual reduction to practice, the stand-off non-operating voltage was 56 volts and the operating voltage was 40 volts, and the pulse width was 350 microseconds. The various inductance and capacitance values were those indicated in the circuit of FIG. 6 herein. The present invention is useful for any size of Class B or Class C amplifier, but is most advantageous for systems with long pulse widths and duty cycles up to 30 or 40 percent. In very high duty systems, the power supply must be stiff enough to supply a large proportion of the pulse energy, and the required energy storage is minimized. A present application is for power amplifiers which drive resonant cavities, such as those used for particle accelerators or electron beam lasers, for example. In these applications, the complex shape of the RF rise time imposed by the network characteristics is not pertinent, since the initial portion of the RF pulse is used only to charge the cavity. Long pulse solid state radar transmitters would benefit from the use of the present invention, particularly those having pulse widths up to several milliseconds. Brute force capacitors for these radars would be very large and expensive.

The transient voltage spike at the beginning of the pulse, if desired, can be reduced by controlling the rise time of the RF drive to the amplifier. Similarly, the transient voltage spike which occurs when the transistor turns off, can be reduced by controlling the fall time of the RF drive to the amplifier. This latter transient voltage spike, may also be reduced by an RC damping network or snubber, or by a zener diode clipper as previously mentioned.

In carrying out the method of the present invention, spaced signal pulses are applied to the input electrode of an electronic switching device having a source of DC voltage connected across the output electrodes. Charging a plurality of individual capacitors with a current having a voltage level substantially greater than the operating voltage of the switching device between each of the spaced signal pulses, and discharging the current from one of the plurality of individual capacitors in response to the application of a signal pulse in order to reduce the voltage applied to the output electrodes to correspond to the operating voltage of the electronic switching device, and discharging the current from at least one other of the plurality of capacitors for maintaining the voltage substantially at the operating level of the switching device for the duration of the pulse.

It will be further apparent to those skilled in the art that various modifications and variations can be made to the system and method of the present invention, without departing from the scope or spirit of the invention; and it is intended that the present invention cover such modifications and variations of this system and method, provided that they come within the scope of the appended claims and their equivalents.

APPENDIX A

NET4.INP    Input File for NET4.FOR

```
350E-6         0.00105         Pulsewidth, Duty
.25E-6         5E-6      DT, TPRINT
1.05           Stepsize Factor
55.0      45.0      1.025     Vraw, Vnetwork, Tilt
0.1039         RL
18140E-6       CTOTAL
110E-6         30.0      'F'       C1,QC1
2370E-6        6.0       'F'       C2,QC2
4550E-6        6.0       'F'       C3,QC3
4530E-6        6.0       'F'       C4,QC4
6690E-6        6.0       'F'       C5,QC5
0.05E-6        0.0001    'F'       L1,RL1
0.041E-6       .0003     'V'       L2,RL2
1.375E-6       .0035     'V'       L3,RL3
1.097E-6       .0029     'V'       L4,RL4
0.917E-6       .0026     'V'       L5,RL5
.31       K23
.18       K34
.21       K45
.009           RA2
0.05E-6        LS
```

NET4.FOR Program Listing                    53,416

```
C   NET4 . . 4 Section Energy Storage Network with Cap series Inductanc
      REAL V(5,1601),I(5,1601),Q(5,1601)
      REAL L1,L2,L3,L4,L5,L6,L7,LS
      REAL K23,K34,K45,K56,K67,M23,M34,M45
      REAL RMS(7)
      CHARACTER*1 C1V,C2V,C3V,C4V,C5V
     1,L1V,L2V,L3V,L4V,L5V,CTYPE
      CHARACTER*8 RESULT(2)
      LOGICAL KEYPRESS
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      OPEN(7,FILE='NET4.INP',STATUS='OLD')
      OPEN(8,FILE='NET4.DAT',STATUS='UNKNOWN')
```

```
C
      CALL DATE(RESULT(1))
      CALL TIME(RESULT(2))
      PRINT*,RESULT(1),'   ',RESULT(2)
      READ(7,*)PULSE,DUTY
      READ(7,*)DT,TPRINT
      READ(7,*)FACTOR
      READ(7,*)VRAW,VNET,TILT
      READ(7,*)RL
      READ(7,*)CTOTAL
      READ(7,*)C1,CQ1,C1V
      READ(7,*)C2,CQ2,C2V
      READ(7,*)C3,CQ3,C3V
      READ(7,*)C4,CQ4,C4V
      READ(7,*)C5,CQ5,C5V
      READ(7,*)L1,RL1,L1V
      READ(7,*)L2,RL2,L2V
      READ(7,*)L3,RL3,L3V
      READ(7,*)L4,RL4,L4V
      READ(7,*)L5,RL5,L5V
      READ(7,*)K23
      READ(7,*)K34
      READ(7,*)K45
      READ(7,*)RA2
      READ(7,*)LS
      CALL UPPER(C1V)
      CALL UPPER(C2V)
      CALL UPPER(C3V)
      CALL UPPER(C4V)
      CALL UPPER(C5V)
      CALL UPPER(L1V)
      CALL UPPER(L2V)
      CALL UPPER(L3V)
      CALL UPPER(L4V)
      CALL UPPER(L5V)
      AMPS=VNET/RL
```

NET4.FOR Program Listing 53,416

```
      RLSTART=RL
      CSCALE=CTOTAL/(C2+C3+C4+C5)
      IF(CTOTAL.LT.1.0E-20)CSCALE=1.0
      C2=C2*CSCALE
      C3=C3*CSCALE
      C4=C4*CSCALE
      C5=C5*CSCALE
      RC1=(159.15E-6)/(C1*CQ1)
      RC2=(159.15E-6)/(C2*CQ2)
      RC3=(159.15E-6)/(C3*CQ3)
      RC4=(159.15E-6)/(C4*CQ4)
      RC5=(159.15E-6)/(C5*CQ5)
      OLDFIT=1.0E6
10    WRITE(*,*)'(1) ANALYZE'
      WRITE(*,*)'    or'
      WRITE(*,*)'(2) OPTIMIZE'
      WRITE(*,*)'    or'
      WRITE(*,*)'(3) Change Input Parameters'
      WRITE(*,*)' '
      READ(*,*)ITYPE
      IF(ITYPE.EQ.3)THEN
      CALL CHANGE(DT,FACTOR,C1V,C2V,C3V,C4V
```

```
     1,C5V,L1V,L2V,L3V,L4V,L5V)
       WRITE(*,*)'Recalculating current FIT...'
       ITERS=1
       IEND=ANINT(PULSE/DT)+1
       CALL NETCAL(OLDFIT,DT)
       WRITE(*,*)'Current FIT= ',OLDFIT
       PRINT*
       GOTO 10
     ELSEIF(ITYPE.EQ.2)THEN
       IEND=ANINT(PULSE/DT)+1
       WRITE(*,*)'How many iterations ?'
       READ(*,*)ITERS
       IF(ITERS.GT.50)ITERS=50
     ELSE
       ITERS=1
       IEND=ANINT((PULSE+50E-6)/DT)+1
       CALL NETCAL(FIT,DT)
       WRITE(*,*)'FIT= ',FIT
       GOTO 26
     ENDIF
     IF(OLDFIT.GE.1000.0)CALL NETCAL(OLDFIT,DT)
     DO 25 ITER=1,ITERS
C
C    Iterate L2
C
     IF(keypress())goto 10
     IF(L2V.EQ.'V')THEN
       WRITE(*,*)'Iterate L2'
       CALL LDIDLE(2,FACTOR,DT,FIT,OLDFIT
     ELSE
     ENDIF
```

NET4.FOR Program Listing

```
C
C    Iterate C2
C
     IF(keypress())goto 10
     IF(C2V.EQ.'V')THEN
       WRITE(*,*)'Iterate C2'
       CALL CDIDLE(2,FACTOR,DT,FIT,OLDFIT)
     ELSE
     ENDIF
C
C    Iterate L3
C
     IF(keypress())goto 10
     IF(L3V.EQ.'V')THEN
       WRITE(*,*)'Iterate L3'
       CALL LDIDLE(3,FACTOR,DT,FIT,OLDFIT)
     ELSE
     ENDIF
C
C    Iterate C3
C
     IF(keypress())goto 10
     IF(C3V.EQ.'V')THEN
       WRITE(*,*)'Iterate C3'
       CALL CDIDLE(3,FACTOR,DT,FIT,OLDFIT)
     ELSE
     ENDIF
C
C    Iterate L4
C
```

```
      IF(keypress())goto 10
      IF(L4V.EQ.'V')THEN
        WRITE(*,*)'Iterate L4'
        CALL LDIDLE(4,FACTOR,DT,FIT,OLDFIT)
      ELSE
      ENDIF
C
C  Iterate C4
C
      IF(keypress())goto 10
      IF(C4V.EQ.'V')THEN
        WRITE(*,*)'Iterate C4'
        CALL CDIDLE(4,FACTOR,DT,FIT,OLDFIT)
      ELSE
      ENDIF
C
C  Iterate L5
C
      IF(keypress())goto 10
      IF(L5V.EQ.'V')THEN
        WRITE(*,*)'Iterate L5'
        CALL LDIDLE(5,FACTOR,DT,FIT,OLDFIT)
      ELSE
```

NET4.FOR Program Listing                53,416

```
      ENDIF
C
C  Iterate C5
C
      IF(keypress())goto 10
      IF(C5V.EQ.'V')THEN
        WRITE(*,*)'Iterate C5'
        CALL CDIDLE(5,FACTOR,DT,FIT,OLDFIT)
      ELSE
      ENDIF
 25   CONTINUE
      GOTO 10
 26   CONTINUE
      WRITE(8,27)VRAW,RLSTART,RESULT(1),VNET,AMPS,RESULT(2)
      WRITE(8,28)1,L1*1.0E6,RL1,1,C1*1.0E6,RC1
      WRITE(8,28)2,L2*1.0E6,RL2,2,C2*1.0E6,RC2
      WRITE(8,28)3,L3*1.0E6,RL3,3,C3*1.0E6,RC3
      WRITE(8,28)4,L4*1.0E6,RL4,4,C4*1.0E6,RC4
      WRITE(8,28)5,L5*1.0E6,RL5,5,C5*1.0E6,RC5
      WRITE(8,42)K23,K34,LS*1.0E6,K45,RA2
      WRITE(8,29)FIT
C
      CALL PCALC(ELOAD,ESTART,EFIN,EMAG,DT)
      DissEff=ELOAD/(ESTART-EFIN-EMAG)
      EFF=ELOAD/(ESTART-EFIN)
      WRITE(8,*)ESTART,' Starting Network Energy'
      WRITE(8,*)EFIN,' Ending Capacitive Energy;'
     1,EMAG,'Inductive Energy'
      WRITE(8,*)ELOAD,'  Energy Delivered to Load'
      WRITE(8,*)' Effective Efficiency = ',EFF
      WRITE(8,*)'Dissipation Efficiency = ',DissEff
      WRITE(8,*)' '
C
      CALL RMSCAL(RMS,DT,DUTY)
      WRITE(8,40) DUTY
```

```
      WRITE(8,41)1,RMS(1),RMS(1)*1E-4/C1
      WRITE(8,41)2,RMS(2),RMS(2)*1E-4/C2
      WRITE(8,41)3,RMS(3),RMS(3)*1E-4/C3
      WRITE(8,41)4,RMS(4),RMS(4)*1E-4/C4
      WRITE(8,41)5,RMS(5),RMS(5)*1E-4/C5
      WRITE(8,*)' '
C
      M23=K23*SQRT(L2*L3)
      M34=K34*SQRT(L3*L4)
      M45=K45*SQRT(L4*L5)
      WRITE(8,*)'     uSEC     Vload     I(1)       I(2)
     1,'    I(3)       I(4)       I(5)       EMAG'
      DO 50 JT=1,IEND
      T=DT*(JT-1)
C
      EMAG=0.5*((L1+L2+M23)*I(2,JT)*I(2,JT)+(L3+M23+M34)*I(3,JT)*I(3,J
     1+(L4+M34+M45)*I(4,JT)*I(4,JT)+(L5+M45)*I(5,JT)*I(5,JT))
C
```

NET4.FOR Program Listing

```
      IF(JT.EQ.1)THEN
        TMS=T*1.0E6
        WRITE(8,30)TMS,V(1,JT),I(1,JT)
     1,I(2,JT),I(3,JT),I(4,JT),I(5,JT),EMAG
      ELSEIF(MOD(JT-1,NINT(TPRINT/DT)).EQ.0)THEN
        TMS=T*1.0E6
        WRITE(8,30)TMS,V(1,JT),I(1,JT)
     1,I(2,JT),I(3,JT),I(4,JT),I(5,JT),EMAG
      ELSE
      ENDIF
50    CONTINUE
      PRINT*,'GRAPH the Response? '
      Read(*,*)CTYPE
      IF((CTYPE.EQ.'Y').OR.(CTYPE.EQ.'y'))THEN
          CALL SYSTEM('NET4G')
      ELSE
      ENDIF
27    FORMAT(1X,/'      Vraw= ',F4.1,' volts',12X,'Rload= ',F6.4
     1,6X,A8/
     21X,'Vnetwork= ',F4.1,' volts',8X,'Load Amps= ',F6.2,6X,A8/)
28    FORMAT(1X,'L'I1,'= ',F7.3,' uH'
     1,2X,F5.4,3X,'C',I1,'= ',F8.1,' uF',2X,F4.3)
29    FORMAT(1X,'FIT= ',F10.3/)
30    FORMAT(1X,F7.1,1X,F9.2,2X,6(F9.2,1X))
40    FORMAT('C    RMS CURRENT     RMS/100UF      Duty= ',F6.4)
41    FORMAT(I1,3X,F9.3,5X,F9.3)
42    FORMAT(1X,'K23= ',F4.2/1X,'K34= ',F4.2,14X,'LS= ',F7.4,' uH'/
     11X,'K45= ',F4.2,14X,'RA2= ',F5.3)
      END
C
      SUBROUTINE RMSCAL(RMS,DT,DUTY)
      REAL V(5,1601),I(5,1601),Q(5,1601)
      REAL L1,L2,L3,L4,L5,L6,L7,LS
      REAL K23,K34,K45,K56,K67
      REAL RMS(7),CRMST(7)
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      DO 3 JJ=1,5
```

```
3     CRMST(JJ)=0.0
      DO 5 JT=1,IEND
      CRMST(1)=CRMST(1)+(I(1,JT)-I(2,JT))*(I(1,JT)-I(2,JT))*DT
      CRMST(2)=CRMST(2)+(I(2,JT)-I(3,JT))*(I(2,JT)-I(3,JT))*DT
      CRMST(3)=CRMST(3)+(I(3,JT)-I(4,JT))*(I(3,JT)-I(4,JT))*DT
      CRMST(4)=CRMST(4)+(I(4,JT)-I(5,JT))*(I(4,JT)-I(5,JT))*DT
      CRMST(5)=CRMST(5)+(I(5,JT))*(I(5,JT))*DT
5     CONTINUE
      RMS(1)=SQRT(CRMST(1)*DUTY/PULSE)
      RMS(2)=SQRT(CRMST(2)*DUTY/PULSE)
      RMS(3)=SQRT(CRMST(3)*DUTY/PULSE)
      RMS(4)=SQRT(CRMST(4)*DUTY/PULSE)
```

NET4.FOR Program Listing

```
      RMS(5)=SQRT(CRMST(5)*DUTY/PULSE)
C     .03333 IS PERIOD OF 1.05% DUTY AT 350 uS PULSE WIDTH
      RETURN
      END
C
      SUBROUTINE PCALC(ELOAD,ESTART,EFIN,EMAG,DT)
      REAL V(5,1601),I(5,1601),Q(5,1601)
      REAL L1,L2,L3,L4,L5,L6,L7,LS
      REAL K23,K34,K45,K56,K67,M23,M34,M45
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      M23=K23*SQRT(L2*L3)
      M34=K34*SQRT(L3*L4)
      M45=K45*SQRT(L4*L5)
      ELOAD=0.0
      JEND=ANINT(PULSE/DT)+1
      DO 10 JT=1,JEND
      ELOAD=ELOAD+I(1,JT)*V(1,JT)*
10    CONTINUE
      JT=ANINT((PULSE)/DT)+1
      ESTART=0.5*(C1+C2+C3+C4+C5)*VRAW*VRAW
      EFIN=0.5*(Q(1,JT)*Q(1,JT)/C1+Q(2,JT)*Q(2,JT)/C2+Q(3,JT)
     1*Q(3,JT)/C3+Q(4,JT)*Q(4,JT)/C4+Q(5,JT)*Q(5,JT)/C5)
      EMAG=0.5*((L1+L2+M23)*I(2,JT)*I(2,JT)+(L3+M23+M34)*I(3,JT)*I(3,JT)
     1+(L4+M34+M45)*I(4,JT)*I(4,JT)+(L5+M45)*I(5,JT)*I(5,JT))
      RETURN
      END
C
      SUBROUTINE UPPER(A)
      CHARACTER*1 A
      J=ICHAR(A)
      IF ((J.LE.122).AND.(J.GE.97)) THEN
         A=CHAR(J-32)
         ELSE
      ENDIF
      RETURN
      END
C
      SUBROUTINE LDIDLE(M,FACTOR,DT,FIT,OLDFIT)
      REAL V(5,1601),I(5,1601),Q(5,1601)
      REAL L1,L2,L3,L4,L5,L6,L7,LS
      REAL K23,K34,K45,K56,K67
      REAL L(7),R(7)
      LOGICAL STEPUP,DONE
```

```
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      EQUIVALENCE (L(1),L1),(R(1),RL1)
```

NET4.FOR Program Listing

```
      STEPUP=.TRUE.
      DONE=.FALSE.
      WRITE(*,*)'FIT= ',OLDFIT,'    L=',L(M),'*'
      DO 125 N=1,16
      IF(DONE)GOTO 125
      IF(STEPUP)THEN
        TEMP=L(M)
        TEMPR=R(M)
        L(M)=L(M)*FACTOR
        R(M)=R(M)*FACTOR
        CALL NETCAL(FIT,DT)
        WRITE(*,*)'FIT= ',FIT,'    L=',L(M)
        IF(FIT.LT.OLDFIT)THEN
          OLDFIT=FIT
        ELSE
          STEPUP=.FALSE.
          L(M)=TEMP
          R(M)=TEMPR
          WRITE(*,*)'FIT= ',OLDFIT,'    L=',L(M),'*'
        ENDIF
      ELSE
        TEMP=L(M)
        TEMPR=R(M)
        L(M)=L(M)/FACTOR
        R(M)=R(M)/FACTOR
        CALL NETCAL(FIT,DT)
        WRITE(*,*)'FIT= ',FIT,'    L=',L(M)
          IF(FIT.LT.OLDFIT)THEN
            OLDFIT=FIT
          ELSE
            L(M)=TEMP
            R(M)=TEMPR
            WRITE(*,*)'FIT= ',OLDFIT,'    L=',L(M),'*'
            DONE=.TRUE.
          ENDIF
      ENDIF
125   CONTINUE
      END
C
      SUBROUTINE CDIDLE(M,FACTOR,DT,FIT,OLDFIT)
      REAL V(5,1601),I(5,1601),Q(5,1601)
      REAL L1,L2,L3,L4,L5,L6,L7,LS
      REAL K23,K34,K45,K56,K67
      REAL C(7),RC(7),CQ(7)
      LOGICAL STEPUP,DONE
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      EQUIVALENCE(C(1),C1),(RC(1),RC1),(CQ(1),CQ1)
      STEPUP=.TRUE.
      DONE=.FALSE.
```

NET4.FOR Program Listing

```
      WRITE(*,*) 'FIT= ',OLDFIT,'   C=',C(M),'*'
      DO 505 N=1,10
      IF(DONE)GOTO 505
      CELSE=CTOTAL-C(M)
      IF(STEPUP)THEN
           TEMP=C(M)
           C(M)=C(M)*FACTOR
           CDEL=C(M)-TEMP
           DO 2 JJ=2,5
           IF(JJ.NE.M)THEN
              C(JJ)=C(JJ)*(1.0-CDEL/CELSE)
           ELSE
           ENDIF
         DO 91 MM=1,5
91       RC(MM)=(159.15E-6)/(C(MM)*CQ(MM))
2        CONTINUE
         CALL NETCAL(FIT,DT)
         WRITE(*,*) 'FIT= ',FIT,'   C=',C(M)
         IF(FIT.LT.OLDFIT)THEN
            OLDFIT=FIT
         ELSE
            STEPUP=.FALSE.
            C(M)=TEMP
            WRITE(*,*) 'FIT= ',OLDFIT,'   C=',C(M),'*'
            DO 4 JJ=2,5
            IF(JJ.NE.M)THEN
               C(JJ)=C(JJ)/(1.0-CDEL/CELSE)
            ELSE
            ENDIF
          DO 92 MM=1,5
92        RC(MM)=(159.15E-6)/(C(MM)*CQ(MM))
4         CONTINUE
         ENDIF
      ELSE
           TEMP=C(M)
           C(M)=C(M)/FACTOR
           CDEL=TEMP-C(M)
           DO 6 JJ=2,5
           IF(JJ.NE.M)THEN
              C(JJ)=C(JJ)*(1.0+CDEL/CELSE)
           ELSE
           ENDIF
         DO 93 MM=1,5
93       RC(MM)=(159.15E-6)/(C(MM)*CQ(MM))
6        CONTINUE
         CALL NETCAL(FIT,DT)
         WRITE(*,*) 'FIT= ',FIT,'   C=',C(M)
           IF(FIT.LT.OLDFIT)THEN
              OLDFIT=FIT
           ELSE
              C(M)=TEMP
              WRITE(*,*) 'FIT= ',OLDFIT,'   C=',C(M),'*'
              DO 8 JJ=2,5
```

NET4.FOR Program Listing

```
      IF(JJ.NE.M)THEN
        C(JJ)=C(JJ)/(1.0+CDEL/CELSE)
      ELSE
```

```fortran
            ENDIF
            DO 94 MM=1,5
94          RC(MM)=(159.15E-6)/(C(MM)*CQ(MM))
8           CONTINUE
            DONE=.TRUE.
            ENDIF
         ENDIF
505      CONTINUE
         RETURN
         END
C
         SUBROUTINE CHANGE(DT,FACTOR,C1V,C2V,C3V,C4V
      1,C5V,L1V,L2V,L3V,L4V,L5V)
         REAL L1,L2,L3,L4,L5,L6,L7,LS
         REAL L1E6,L2E6,L3E6,L4E6,LSE6
         REAL K23,K34,K45,K56,K67
         CHARACTER*1 C1V,C2V,C3V,C4V,C5V
      1,L1V,L2V,L3V,L4V,L5V
         CHARACTER*1 CTYPE
         COMMON/PARMS/C1,C2,C3,C4,C5,C6,C7,RC1,RC2,RC3,RC4,RC5,RC6,RC7,
      1L1,L2,L3,L4,L5,L6,L7,LS,RL1,RL2,RL3,RL4,RL5,RL6,RL7,
      2RL,VRAW,VNET,K23,K34,K45,K56,K67,CQ1,CQ2,CQ3,CQ4,CQ5,CQ6,CQ7,
      3CTOTAL,RA2
         DTE6=DT*1E6
5        WRITE(*,*)
         WRITE(*,*)
         WRITE(*,*)
         WRITE(*,*)
         WRITE(*,*)
         WRITE(*,*)
         WRITE(*,*)
         WRITE(*,*) '          CHANGE MENU'
         WRITE(*,*) ' '
         WRITE(*,10)FACTOR
         WRITE(*,11)DTE6
         WRITE(*,12)CTOTAL*1E6
         WRITE(*,13)C1*1E6,CQ1,C1V
         WRITE(*,14)C2*1E6,CQ2,C2V
         WRITE(*,15)C3*1E6,CQ3,C3V
         WRITE(*,16)C4*1E6,CQ4,C4V
         WRITE(*,17)C5*1E6,CQ5,C5V
         WRITE(*,18)L1*1.0E6,RL1,L1V
         WRITE(*,19)L2*1.0E6,RL2,L2V
         WRITE(*,20)L3*1.0E6,RL3,L3V
         WRITE(*,21)L4*1.0E6,RL4,L4V
         WRITE(*,22)L5*1.0E6,RL5,L5V
         WRITE(*,23)RA2
         WRITE(*,*) 'Z)    END OF CHANGES, RETURN TO PROGRAM'
         WRITE(*,*) '? '
         READ(*,1)CTYPE
```

NET4.FOR Program Listing

```fortran
         CALL UPPER(CTYPE)
         IF(CTYPE.EQ.'Z')RETURN
         IF(CTYPE.EQ.'A')THEN
            WRITE(*,*) 'Old FACTOR= ',FACTOR
            WRITE(*,*) 'Enter new FACTOR '
            READ(*,*)FACTOR
            GOTO 5
         ELSEIF (CTYPE.EQ.'B')THEN
```

```
      WRITE(*,*) 'Old STEP Size= ',DT*1.0E6
      WRITE(*,*) 'Enter new STEP Size '
      READ(*,*)DTE6
      DT=DTE6*1.0E-6
      GOTO 5
    ELSEIF (CTYPE.EQ.'C') THEN
      WRITE(*,12)CTOTAL*1.0E6
      WRITE(*,*) 'Enter New CTOTAL '
      READ(*,*)CTOTE6
      CTOTAL=CTOTE6*1E-6
      CSCALE=CTOTAL/(C2+C3+C4+C5)
      IF(CTOTAL.LT.1.0E-20)CSCALE=1.0
      C2=C2*CSCALE
      C3=C3*CSCALE
      C4=C4*CSCALE
      C5=C5*CSCALE
      RC1=(159.15E-6)/(C1*CQ1)
      RC2=(159.15E-6)/(C2*CQ2)
      RC3=(159.15E-6)/(C3*CQ3)
      RC4=(159.15E-6)/(C4*CQ4)
      RC5=(159.15E-6)/(C5*CQ5)
      GOTO 5
    ELSEIF (CTYPE.EQ.'D') THEN
      WRITE(*,13)C1*1E6,CQ1,C1V
      WRITE(*,*) 'Enter New C1, CQ1, C1V '
      READ(*,*)C1E6,CQ1,C1V
      CALL UPPER(C1V)
      C1=C1E6*1E-6
      RC1=(159.15E-6)/(C1*CQ1)
      GOTO 5
    ELSEIF (CTYPE.EQ.'E') THEN
      WRITE(*,14)C2*1E6,CQ2,C2V
      WRITE(*,*) 'Enter New C2, CQ2, C2V '
      READ(*,*)C2E6,CQ2,C2V
      CALL UPPER(C2V)
      C2=C2E6*1E-6
      RC2=(159.15E-6)/(C2*CQ2)
      GOTO 5
    ELSEIF (CTYPE.EQ.'F') THEN
      WRITE(*,15)C3*1E6,CQ3,C3V
      WRITE(*,*) 'Enter New C3, CQ3, C3V '
      READ(*,*)C3E6,CQ3,C3V
      CALL UPPER(C3V)
      C3=C3E6*1E-6
      RC3=(159.15E-6)/(C3*CQ3)
```

NE14.FOR Program Listing

```
      GOTO 5
    ELSEIF (CTYPE.EQ.'G') THEN
      WRITE(*,16)C4*1E6,CQ4,C4V
      WRITE(*,*) 'Enter New C4, CQ4, C4V '
      READ(*,*)C4E6,CQ4,C4V
      CALL UPPER(C4V)
      C4=C4E6*1E-6
      RC4=(159.15E-6)/(C4*CQ4)
      GOTO 5
    ELSEIF (CTYPE.EQ.'H') THEN
      WRITE(*,17)C5*1E6,CQ5,C5V
      WRITE(*,*) 'Enter New C5, CQ5,C5V '
      READ(*,*)C5E6,CQ5,C5V
      CALL UPPER(C5V)
      C5=C5E6*1E-6
```

```
          RC5=(159.15E-6)/(C5*CQ5)
          GOTO 5
        ELSEIF (CTYPE.EQ.'I')THEN
          WRITE(*,18)L1*1.0E6,RL1,L1V
          WRITE(*,*)'Enter New L1, RL1, L1V '
          READ(*,*)L1E6,RL1,L1V
          L1=L1E6*1.0E-6
          CALL UPPER(L1V)
          GOTO 5
        ELSEIF (CTYPE.EQ.'J')THEN
          WRITE(*,19)L2*1.0E6,RL2,L2V
          WRITE(*,*)'Enter New L2, RL2, L2V '
          READ(*,*)L2E6,RL2,L2V
          L2=L2E6*1.0E-6
          CALL UPPER(L2V)
          GOTO 5
        ELSEIF (CTYPE.EQ.'K')THEN
          WRITE(*,20)L3*1.0E6,RL3,L3V
          WRITE(*,*)'Enter New L3, RL3, L3V '
          READ(*,*)L3E6,RL3,L3V
          L3=L3E6*1.0E-6
          CALL UPPER(L3V)
          GOTO 5
        ELSEIF (CTYPE.EQ.'L')THEN
          WRITE(*,21)L4*1.0E6,RL4,L4V
          WRITE(*,*)'Enter New L4, RL4, L4V '
          READ(*,*)L4E6,RL4,L4V
          L4=L4E6*1.0E-6
          CALL UPPER(L4V)
          GOTO 5
        ELSEIF (CTYPE.EQ.'M')THEN
          WRITE(*,22)L5*1.0E6,RL5,L5V
          WRITE(*,*)'Enter New L5, RL5, L5V '
          READ(*,*)L5E6,RL5,L5V
          L5=L5E6*1.0E-6
          CALL UPPER(L5V)
          GOTO 5
        ELSEIF (CTYPE.EQ.'N')THEN
          WRITE(*,23)RA2
          WRITE(*,*)'Enter New RA2 '
          READ(*,*)RA2
          GOTO 5
        ENDIF
   1    FORMAT(A1)
   10   FORMAT(' (A)    FACTOR= ',F4.2)
   11   FORMAT(' (B)    DT= ',F4.3)
   12   FORMAT(' (C)    CTOTAL= ',F8.1)
   13   FORMAT(' (D)    C1, CQ1  ',F8.1,' uF',2X,F6.2,2X,A1)
   14   FORMAT(' (E)    C2, CQ2  ',F8.1,' uF',2X,F6.2,2X,A1)
   15   FORMAT(' (F)    C3, CQ3  ',F8.1,' uF',2X,F6.2,2X,A1)
   16   FORMAT(' (G)    C4, CQ4  ',F8.1,' uF',2X,F6.2,2X,A1)
   17   FORMAT(' (H)    C5, CQ5  ',F8.1,' uF',2X,F6.2,2X,A1)
   18   FORMAT(' (I)    L1, RL1  ',F7.3,' uH',2X,F5.4,2X,A1)
   19   FORMAT(' (J)    L2, RL2  ',F7.3,' uH',2X,F5.4,2X,A1)
   20   FORMAT(' (K)    L3, RL3  ',F7.3,' uH',2X,F5.4,2X,A1)
   21   FORMAT(' (L)    L4, RL4  ',F7.3,' uH',2X,F5.4,2X,A1)
   22   FORMAT(' (M)    L5, RL5  ',F7.3,' uH',2X,F5.4,2X,A1)
   23   FORMAT(' (N)    RA2          ',F5.3)
        RETURN
        END
```

```
C
      LOGICAL FUNCTION KEYPRESS()
      integer AH,AL
      integer*2 intarray(9)
      intarray(1)=2816
C          interrupt 21H is 33D
C.         2816D is 0800H for function request 0BH
      call intrup(intarray,33)
C     AH=intarray(1)/256
      AL=MOD(intarray(1),256)
      IF(AL.eq.255)THEN
         KEYPRESS=.TRUE.
        ELSE
         KEYPRESS=.FALSE.
      ENDIF
      RETURN
      END
C
      SUBROUTINE NETCAL(FIT,DT)
      REAL V(5,1601),I(5,1601),Q(5,1601),D(5,1601)
      REAL L1,L2,L3,L4,L5,L6,L7,LS
      REAL K23,K34,K45,K56,K67
      REAL M23,M34,M45
      COMMON V,I,Q,IEND,PULSE,TILT
      COMMON/PARMS/C1,C2,C3,C4,C5,C6,C7,RC1,RC2,RC3,RC4,RC5,RC6,RC7,
     1L1,L2,L3,L4,L5,L6,L7,LS,RL1,RL2,RL3,RL4,RL5,RL6,RL7,
     2RL,VRAW,VNET,K23,K34,K45,K56,K67,CQ1,CQ2,CQ3,CQ4,CQ5,CQ6,CQ7,
     3CTOTAL,RA2
      DO 1 J=1,5
      I(J,1)=0.0
      D(J,1)=0.0
    1 D(J,2)=0.0
      V(1,1)=VRAW
      V(2,1)=VRAW
      V(3,1)=VRAW
      V(4,1)=VRAW
      V(5,1)=VRAW
      Q(1,1)=C1*V(1,1)
      Q(2,1)=C2*V(2,1)
      Q(3,1)=C3*V(3,1)
      Q(4,1)=C4*V(4,1)
      Q(5,1)=C5*V(5,1)
      M23=K23*SQRT(L2*L3)
      M34=K34*SQRT(L3*L4)
      M45=K45*SQRT(L4*L5)
      I(1,1)=V(1,1)/(RL+RC1)
      DO 50 JT=2,IEND
      T=DT*(JT-1)
      IF(T.GT.PULSE+DT/2.0)RL=1.0E4
C
      D(1,JT)=0.0
      I(1,JT)=V(1,JT-1)/RL
      Q(1,JT)=Q(1,JT-1)+(I(2,JT-1)-I(1,JT-1))*DT
      V(1,JT)=Q(1,JT)/C1+(I(2,JT-1)-I(1,JT))*RC1
C
      D(2,JT)=(V(2,JT-1)-V(1,JT-1)-I(2,JT-1)*(RL1+RL2)
     1-M23*D(3,JT-1))/(L1+L2+LS)
      I(2,JT)=I(2,JT-1)+D(2,JT)*DT
      Q(2,JT)=Q(2,JT-1)+(I(3,JT-1)-I(2,JT))*DT
      V(2,JT)=Q(2,JT)/C2+(I(3,JT-1)-I(2,JT))*(RC2+RA2)
     1+(D(3,JT-1)-D(2,JT-1))*LS
C
      D(3,JT)=(V(3,JT-1)-V(2,JT-1)-I(3,JT-1)*RL3-M23*D(2,JT-1)-
     1M34*D(4,JT-1))/(L3+LS+LS)
      I(3,JT)=I(3,JT-1)+D(3,JT)*DT
      Q(3,JT)=Q(3,JT-1)+(I(4,JT-1)-I(3,JT))*DT
```

```
      V(3,JT)=Q(3,JT)/C3+(I(4,JT-1)-I(3,JT))*RC3
     1+(D(4,JT-1)-D(3,JT-1))*LS
C
      D(4,JT)=(V(4,JT-1)-V(3,JT-1)-I(4,JT-1)*RL4-M34*D(3,JT-1)-
     1M45*D(5,JT-1))/(L4+LS+LS)
      I(4,JT)=I(4,JT-1)+D(4,JT)*DT
      Q(4,JT)=Q(4,JT-1)+(I(5,JT-1)-I(4,JT))*DT
      V(4,JT)=Q(4,JT)/C4+(I(5,JT-1)-I(4,JT))*RC4
     1+(D(5,JT-1)-D(4,JT-1))*LS
C
      D(5,JT)=(V(5,JT-1)-V(4,JT-1)-I(5,JT-1)*RL5-
     1M45*D(4,JT-1))/(L5+LS+LS)
      I(5,JT)=I(5,JT-1)+D(5,JT)*DT
      Q(5,JT)=Q(5,JT-1)+(-I(5,JT))*DT
      V(5,JT)=Q(5,JT)/C5+(-I(5,JT))*RC5
     1+(-D(5,JT-1))*LS
C
50    CONTINUE
```

NET4.FOR Program Listing

```
      FNUM=0.0
      ERR=0.0
C       Do not fit the first 5 microseconds !
      TBLANK=5.0E-6
      DO 60 JT=1,IEND
      T=DT*(JT-1)
      IF(MOD(NINT(T*1.0E6),2).NE.0)THEN
         GOTO 60
      ELSEIF(T.LT.TBLANK)THEN
         GOTO 60
      ELSEIF(V(1,JT).LT.VNET.AND.T.LT.TBLANK)THEN
         GOTO 60
      ELSEIF(T.GT.PULSE)THEN
         GOTO 60
      ELSE
         ERR=ERR+ABS((VNET*(1.0+(T*(TILT-1.0)/PULSE))-V(1,JT))**3)
         FNUM=FNUM+1.0
      ENDIF
60    CONTINUE
      FIT=(ERR/FNUM)**0.333333
C
      CALL PCALC(ELOAD,ESTART,EFIN,EMAG,DT)
      RETURN
      END
```

I claim as my invention:

1. A pulsed amplifier, comprising;
an electronic switching device, having input electrode means and output electrode means operative to switch between a conducting and nonconducting state in response to the application of spaced pulses to the input electrode means for producing corresponding spaced pulses on the output electrode means, said switching device being capable of withstanding without breakdown, a DC voltage having a first level applied to the output electrode means during the nonconducting state and having an operating DC voltage with a second level less than the first level for application to the output electrode means during the conducting state;
a plurality of circuit sections electrically connected to the output electrode means, each of the circuit sections including an inductance and a capacitance, each inductance being series connected to one another, each capacitance being connected in parallel to each other between each respective inductance;
a DC voltage source electrically connected to the output electrode means in series with the plurality of circuit sections for charging during the non-conducting state the capacitance of each circuit section with current having a voltage substantially corresponding to the first value; and
the inductance and capacitance of each of the circuit sections having a value effective to discharge the capacitance of each circuit section successively at a decreasing frequency for reducing the applied voltage of the first value to an applied voltage having the second value during a selected first portion of the pulse and maintaining the second voltage value for the duration of the pulse.

2. An amplifier according to claim 1 wherein the electronic switching device includes an RF power transistor.

3. An amplifier according to claim 1, wherein the electronic switching device comprises a transistor with a base electrode as the input electrode means and a collector and emitter electrode as the output electrode means.

4. An amplifier according to claim 2, wherein said transistor is operative to switch between a conducting and non-conducting state in response to the application of spaced RF pulses to the base electrode.

5. A method of generating amplified output pulses in an amplifier having an electronic switching device with input and output electrodes and a source of DC voltage connected across the output electrodes for providing an operating voltage for the switching device, said method comprising:
applying spaced RF signal pulses to the input electrode;
charging a plurality of individual capacitors with a current having a voltage level substantially greater than the operating voltage of the switching device between each of the spaced RF pulses, discharging the current from one of said plurality of individual capacitors in response to the application of the signal pulse for reducing the voltage level applied to the output electrodes to a level corresponding to the operating voltage; and
discharging the current from at least one other of the plurality of the capacitors for maintaining the voltage substantially at the operating level of the switching device for the duration of the pulse.

6. A method according to claim 5, wherein the step of discharging the current from said one of said plurality of individual capacitors includes a partial discharge of said capacitor within a time period at the beginning of each said spaced RF pulses, said time period being of a duration insufficient to permit said voltage level from adversely affecting said electronic switching device during conduction.

7. A method of generating amplified RF output pulses in an amplifier having a transistor with input and output electrodes, and a source of DC voltage connected to bias an output electrode and provide an operating voltage for the switching device, said method comprising:
applying spaced RF signal pulses to the input electrode, charging a plurality of individual capacitors connected to the DC voltage source and the output electrode with a current having a first voltage level substantially greater than the operating voltage of the transistor during nonconduction of the transistor between each of the spaced signal pulses, discharging the current from one of said plurality of individual capacitors in response to the application of an RF signal pulse to reduce the first voltage level to a second voltage level corresponding to the operating voltage of the transistor; and
discharging the current from at least one other of the plurality of capacitors at a rate sufficient to maintain the voltage substantially at the second level for the duration of the pulse.

8. A method according to claim 7, wherein the step of discharging the current from said one individual capacitor includes discharging current from the individual capacitor closest to the output electrode of the transistor.

9. A method according to claim 7, wherein the step of discharging the current from said one of the individual capacitors includes discharging at a first frequency during a first portion of the pulse, and wherein the step of discharging the current from one other of the said capacitors includes discharging said one other capacitor at a frequency no greater than the first frequency.

10. A method according to claim 7, wherein the step of discharging the current from said one of the individual capacitors includes discharging at a first frequency during a first portion of the pulse, and wherein the step of discharging the current from one other of the said capacitors includes discharging said one other capacitor at a frequency less than the first frequency.

11. A pulsed amplifier, comprising:
a transistor having a base, emitter and collector electrodes, said transistor being operative to switch between a conducting operating state and nonconducting state in response to the application of spaced RF signal pulses to the base electrode for producing amplified RF pulses on the collector electrode, said transistor being capable of withstanding without breakdown a DC voltage having a first level applied across the collector and emitter electrodes during the nonconducting state and a DC voltage having a second level less than the first value and corresponding to the conducting operating state of the transistor for application across the collector and emitter electrodes during the conducting operating state;
a plurality of serially connected circuit sections electrically connected to the collector electrode, each of the circuit sections including an inductance and a capacitance, each inductance being series connected to one another, each capacitance being connected in parallel with each other between each respective inductance;

a DC voltage source electrically connected across the collector and emitter electrodes in series with the plurality of circuit sections for charging during the nonconducting state the capacitance of each circuit section with current having a voltage substantially corresponding to the first level; and the inductance and capacitance of each of the circuit sections having a value effective to discharge the capacitance of each circuit section successively at a decreased frequency for reducing the applied voltage of the first level to an applied voltage of the second level during a selected first portion of the pulse and maintaining the second voltage level for the duration of the pulse.

12. A pulsed amplifier according to claim 11, wherein the inductance and capacitance of each of the circuit sections is selected such that the discharge of the capacitance of each of the circuit sections adjacent said closest circuit section occurs at different times during each pulse.

13. A pulsed amplifier according to claim 11, wherein the capacitance of each circuit section appreciably discharges during each pulse while maintaining the second level voltage substantially constant.

14. A pulsed amplifier according to claim 11, wherein the inductance and capacitance of one of said circuit sections connected adjacent the collector electrodes is selected to discharge during a first portion of the pulse for maintaining the reliability of the transistor.

15. A pulsed amplifier according to claim 11, wherein the inductance and capacitance of said serially connected circuit sections is selected to discharge the capacitance from said first voltage level to said second voltage level in less than approximately five microseconds.

* * * * *